(12) United States Patent
Hutton

(10) Patent No.: US 7,394,287 B1
(45) Date of Patent: Jul. 1, 2008

(54) PROGRAMMABLE LOGIC DEVICE HAVING COMPLEX LOGIC BLOCKS WITH IMPROVED LOGIC CELL FUNCTIONALITY

(75) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/751,392

(22) Filed: May 21, 2007

(51) Int. Cl.
*H03K 19/173* (2006.01)
(52) U.S. Cl. .......................................... 326/38; 326/41
(58) Field of Classification Search ............. 326/37–41, 326/46, 52–55
See application file for complete search history.

(56) References Cited

U.S. PATENT DOCUMENTS

| | | | |
|---|---|---|---|
| 6,943,580 | B2 | 9/2005 | Lewis et al. |
| 7,167,022 | B1 | 1/2007 | Schleicher et al. |
| 7,185,035 | B1 | 2/2007 | Lewis |
| 7,268,584 | B1 * | 9/2007 | Cashman et al. ............... 326/39 |
| 7,274,214 | B1 * | 9/2007 | Young .......................... 326/41 |
| 2007/0063732 | A1 * | 3/2007 | Kaptanoglu et al. ........... 326/40 |

OTHER PUBLICATIONS

Baeckler et al., "Logic Cell Supporting Addition of Three Binary Words," U.S. Appl. No. 10/718,968, filed Nov. 21, 2003.
Hutton et al., "Method and Apparatus for Implementing Additional Registers in Field Programmable Gate Arrays to Reduce Design Size," U.S. Appl. No. 11/328,407, filed Jan. 9, 2006.
Schleicher et al., "Omnibus Logic Element," U.S. Appl. No. 11/607,171, filed Dec. 1, 2006.
Virtex-5 User Guide, UG190 (v3.0) Feb. 2, 2007, downloaded from www.xilinx.com.

* cited by examiner

*Primary Examiner*—Don P Le
(74) *Attorney, Agent, or Firm*—Weaver Austin Villeneuve & Sampson LLP

(57) ABSTRACT

A CLB-based PLD with logic cells having improved logic, register, arithmetic, logic packing and timing functions and capabilities is disclosed. The CLBs of the PLD are arranged in rows and columns of an array and are interconnect by a plurality of interconnect lines. Each of the plurality of CLBs has a first slice of logic cells and a second slice of logic cells arranged in a first column and a second column. First and second carry chains are provided between each of the logic cells of each column. At least one of the logic cells includes one or more Look Up Tables for implanting logic functions on a set of inputs provided to the one logic cell and an arithmetic logic circuit configured to receive a carry-in signal and to generate a carry-out signal forming part of the first carry chain. In one embodiment, the logic cell further includes a first output register and a second output register and the set of outputs generated by the logic cell are partitioned among the first output register and the second output register. In another embodiment, an output of one of the registers is provided as an input to one of the Look Up Tables of the cell through a register feedback connection. In yet another embodiment, the set of inputs provided to a first and a second of the Look Up Tables are different, enabling a higher degree of logic efficiency or "packing" by enabling each cell to perform logic functions on two different sets of inputs as opposed to only the same set of inputs. Finally, in another embodiment, the arithmetic logic circuit is capable of generating two SUM output signals.

23 Claims, 13 Drawing Sheets

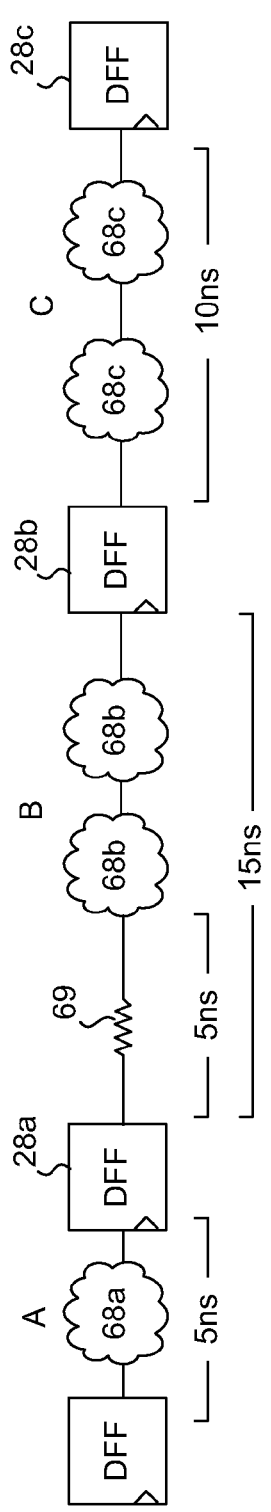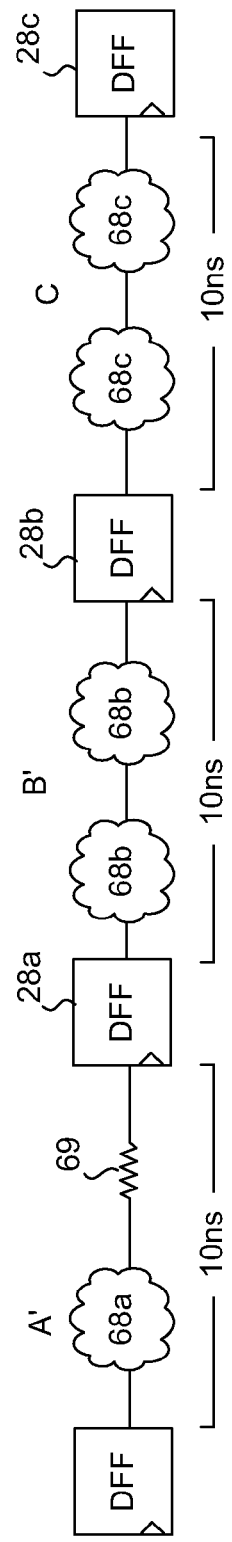
FIG. 5A
FIG. 5B

PROGRAMMABLE LOGIC DEVICE HAVING COMPLEX LOGIC BLOCKS WITH IMPROVED LOGIC CELL FUNCTIONALITY

BACKGROUND

1. Field of the Invention

The present invention generally relates to Complex Logic Block (CLB) based Programmable Logic Devices (PLDs), and more particularly, CLBs including a plurality of slices, each having one or more logic cells with improved logic, register, arithmetic, logic packing and timing functions and capabilities.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

The architecture of most PLDs defines a two-dimensional array of logic blocks. Row and column inter-logic block lines, typically of varying length and speed, provide signal and clock interconnects between the blocks of logic in the array. In one type of commercially available PLD, the blocks of logic are referred to as Complex Logic Blocks or CLBs. Each CLB includes a pair of slices. The two slices in each CLB do not have direct connections with one another and are organized in different columns. The slices in each column, however, are connected to the slices of the above and below CLBs, creating independent carry chains. For example, the slices in the first and second columns each receive a carry in (Cin) signal from the previous CLB and generate a carry out signal provided to the next CLB respectively.

Each slice typically includes four logic cells (hereafter simply referred to as "cells"). Each cell includes a 6-input logic function generator, typically referred to as a Look Up Table (LUT), arithmetic circuitry for receiving and generating Cin and Cout carry signals, an output register for generating a registered output, a non-registered output, and storage elements for performing ROM functions. The LUT can be configured as either a single 6-input LUT, or two five input LUTs, both receiving the same set of inputs (e.g., A1-A5).

For more details on CLB based PLDs having slices, see for example the "Virtex-5 User Guide", UG190 (v3.0), Feb. 2, 2007, published by Xilinx Corporation, San Jose, Calif., pages 155-181, incorporated by reference herein for all purposes.

The problem with the aforementioned cells is its lack of flexibility and limitations in performing logic, various register, arithmetic functions and a lack of flexibility for efficiently packing logic functions into the cell.

A PLD with CLBs defining slices having one or more logic cells with improved logic, register, arithmetic, logic packing and timing functions and capabilities is therefore needed.

SUMMARY OF THE INVENTION

A CLB-based PLD with logic cells having improved logic, register, arithmetic, logic packing and timing functions and capabilities is disclosed. The CLBs of the PLD are arranged in rows and columns of an array and are interconnect by a plurality of interconnect lines. Each of the plurality of CLBs has a first slice of logic cells and a second slice of logic cells arranged in a first column and a second column respectively. First and second carry chains are provided between each of the logic cells of each column of slices. At least one of the logic cells includes one or more Look Up Tables for implanting logic functions on a set of inputs provided to the one logic cell and an arithmetic logic circuit configured to receive a carry-in signal and to generate a carry-out signal forming part of the first carry chain. In one embodiment, the logic cell further includes a first output register and a second output register and the set of outputs generated by the logic cell are partitioned among the first output register and the second output register. In another embodiment, an output of one of the registers is provided as an input to one of the Look Up Tables of the cell through a register feedback connection. In yet another embodiment, the set of inputs provided to a first and a second of the Look Up Tables are different, enabling a higher degree of logic efficiency or "packing" by enabling each cell to perform logic functions on two different sets of inputs as opposed to only the same set of inputs. Finally, in another embodiment, the arithmetic logic circuit is capable of generating two SUM output signals.

BRIEF DESCRIPTION OF THE DRAWINGS

The invention may best be understood by reference to the following description taken in conjunction with the accompanying drawings, which illustrate specific embodiments of the present invention.

FIGS. 5A and 5B are a block diagrams illustrating how register feedback aids in balancing delays between stages of a logic circuit design to reduce the overall propagation delays of the circuit according to the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
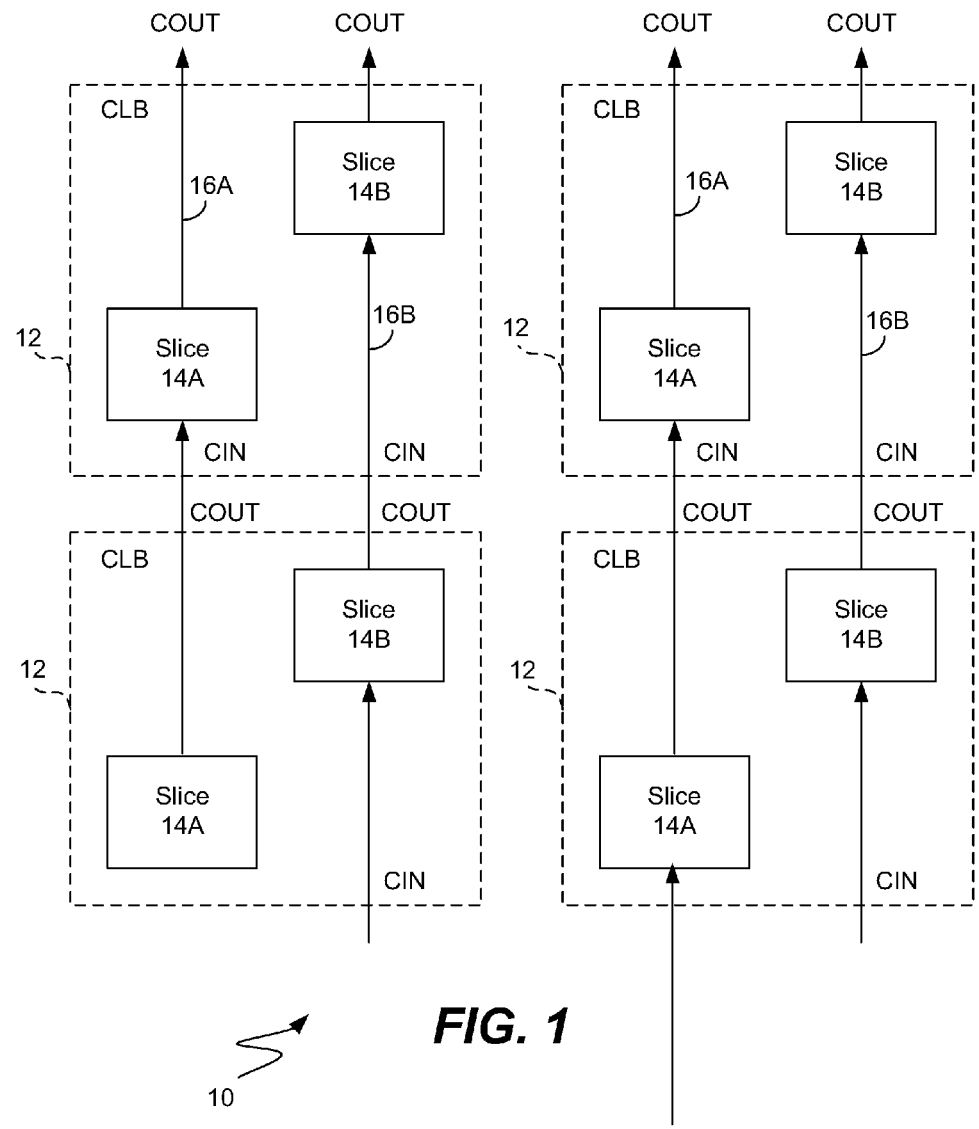
FIG. 1 is a block diagram illustrating a programmable logic device according to the present invention.

Referring to FIG. 1, a block diagram of a programmable logic device (PLD) 10 of the present invention is shown. The PLD includes a plurality of Complex Logic Blocks (CLBs) 12 arranged in an array of rows and columns. Each CLB 12 includes a first slice 14A and a second slice 14B. The slices 14A of the CLBs 12 in a given column are interconnected by a first carry chain 16A, as designated by the carry-in (Cin) and carry-our (Cout) lines received and outputted by the slices 14A. Similarly, the slices 14B are interconnected by a second carry chain 16B, as designated by the carry-in (Cin) and carry-our (Cout) lines received and outputted by the slices 14B. Although not illustrated, the individual CLBs 12 are interconnected by a plurality of inter-CLB lines, as is well known in the art. For more details on CLB based PLDs having slices, see for example the "Virtex-5 User Guide", UG190 (v3.0), Feb. 2, 2007, published by Xilinx Corporation, San Jose, Calif., pages 155-181, incorporated by reference herein for all purposes.

Each slice 14 includes one or more logic cells. In one specific embodiment, each slice 14 includes four logic cells. In other embodiments, either more or fewer logic cells may be used per slice 14. In alternative embodiments for example, one to three, or five through sixteen or more logic cells may be included per CLB 14. In general, the number of specific logic cells in a CLB is arbitrary, and should not be construed as limiting the present invention.

Figure 2:
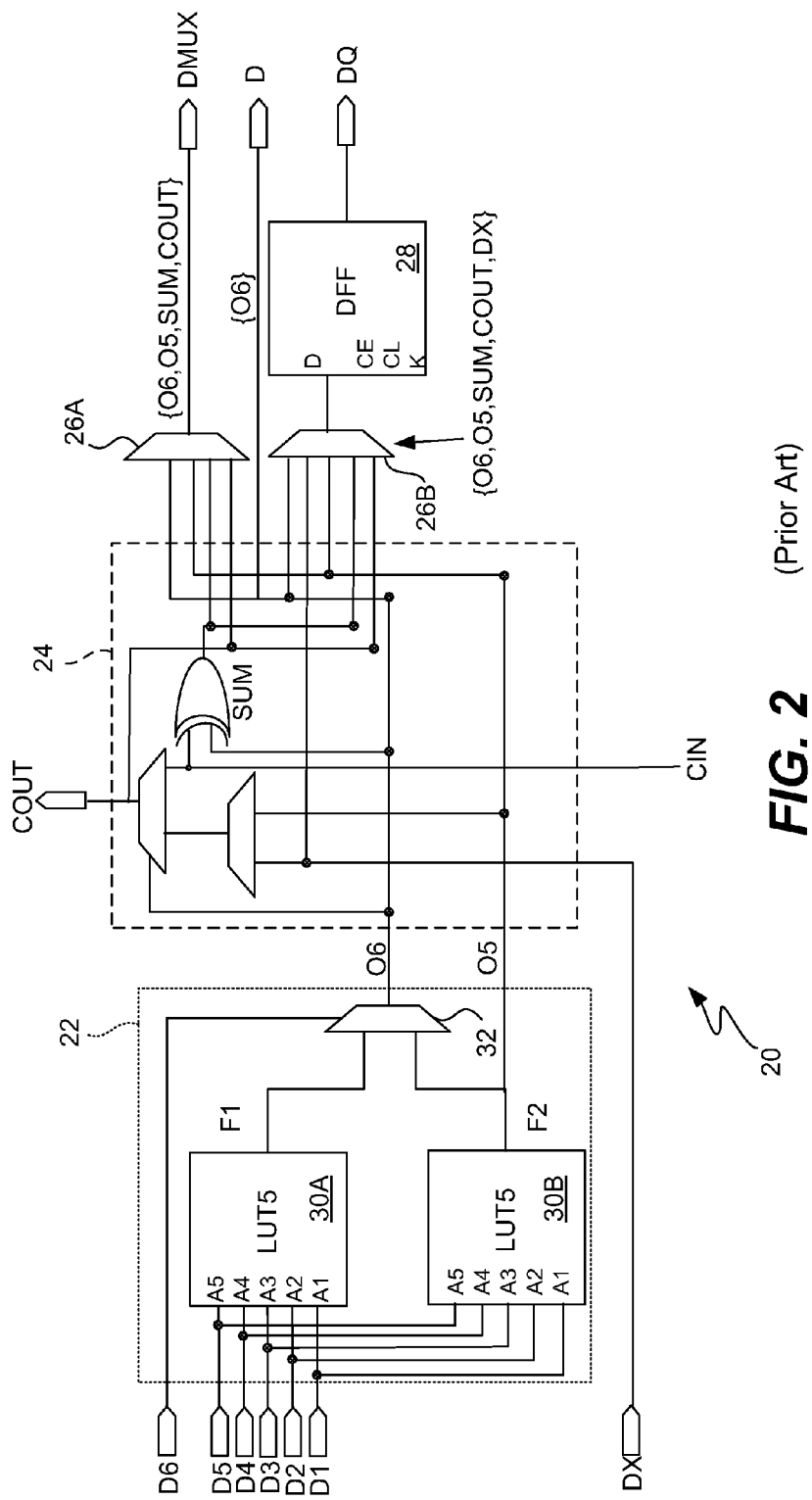
FIG. 2 is a block diagram of a logic cell used in a CLB based PLD architecture according to the prior art.

Referring to FIG. 2, a block diagram of a logic cell 20 according to the prior art is shown. The logic cell 20 includes a six-input Look Up Table 22, an arithmetic logic circuit 24, two output multiplexers 26A and 26B, and an output register 28.

The six input Look Up Table 22 includes two five-input Look Up Tables 30A and 30B, each configured to receive the same set of inputs D1 through D5, and a Look Up Table output multiplexer 32, which is configured to receive a sixth input D6. With this configuration, the Look Up Table 22 can be configured as either a single six-input Look Up Table capable of generating a single logic function "O6", or two five-input logic functions designated F1(D1, D2, D3, D4, D5) and F2(D1, D2, D3, D4, D5) respectively.

The arithmetic circuit 22 is configured to implement arithmetic logic functions, such as counters and shifter registers. The arithmetic circuit 22 is configured to receive a seventh input (DX) and a carry-in (Cin) from the logic cell below. In response, the arithmetic circuit generates a SUM signal and a carry out signal (Cout), which is provided to the cell above.

The output multiplexer 26A generates a non-registered output (DMUX) selected from inputs (O6, O5, SUM and Cout). The output multiplexer 26B selects from inputs (O6, O5, SUM, COUNT, and DX). The register 28 generates a registered output (DQ) from the input selected by multiplexer 26B. A third output (D) is derived from the Look Up Table output multiplexer 34 (O6).

Figure 3:
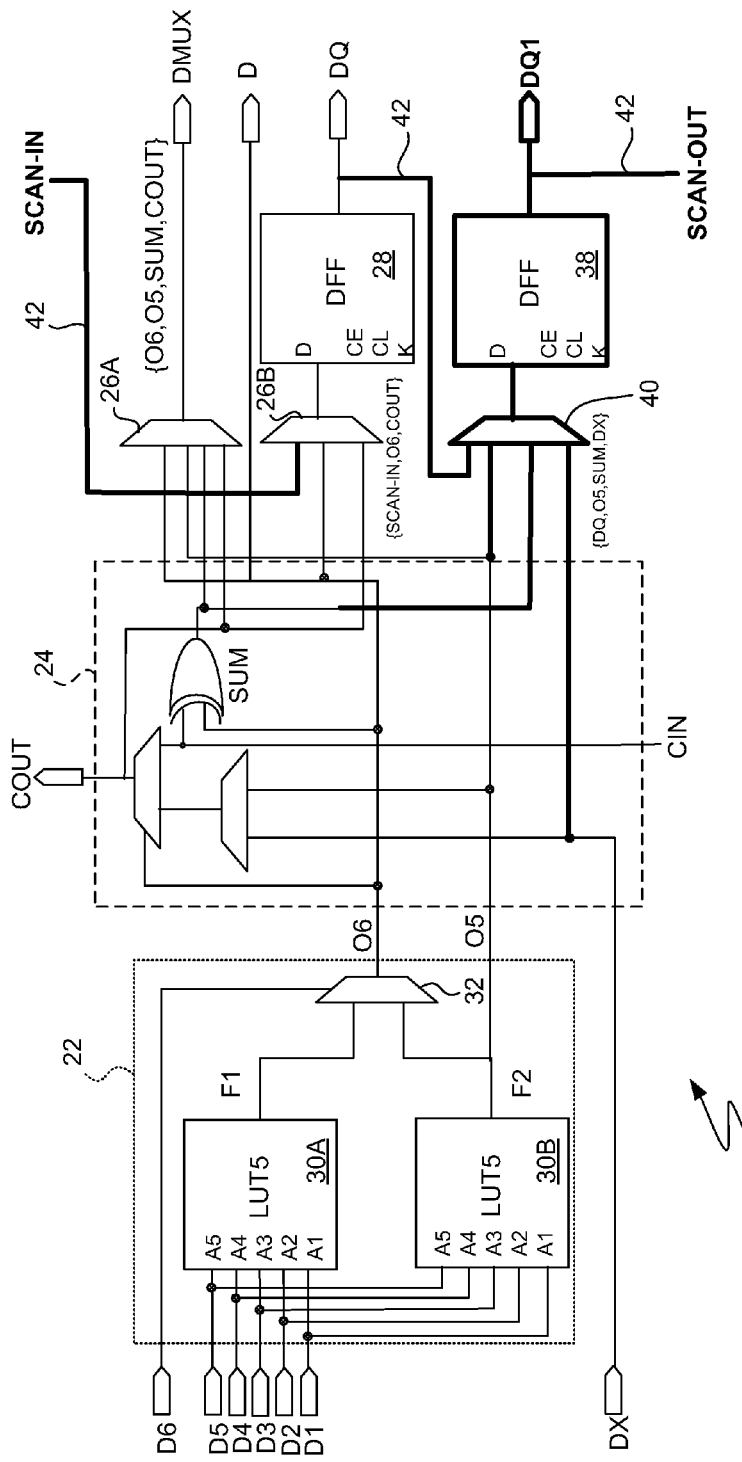
FIG. 3 is a logic cell with enhanced register functionality according to one embodiment of the present invention.

FIG. 3 is a logic cell with enhanced register functionality according to one embodiment of the present invention. The logic cell 36 is similar to the cell 20, except it additionally includes a second output register 38, output multiplexer 40, and a scan-chain 42. In the embodiment shown, the output multiplexer 26B is configured to receive (scan-in, O6 and Cout), while the multiplexer 40 is configured to receive (DQ, O5, SUM, and DX). The second output register is configured to generate output (DQ1), the value of which is determined by the selection of multiplexer 40.

The scan-chain 42 in FIG. 3 allows the output of one register (i.e., 28) to be provided as an input to the next register (i.e., 38). For example in FIG. 3, the register 28 receives the "scan-in" signal from the above cell, whereas the register 38 provides the "scan-out" signal to the next cell.

The enhanced register functionality of logic cells 36 provides a number of advantages over conventional cells, such as that illustrated in FIG. 2. The scan-chain 42 through the registers 28 and 38 allows greater functionality, such as pipelining and/or the creation of shift registers, between cells. This feature was not possible in the prior cell. The partitioning of the outputs among the two registers 28 and 38 also provides greater flexibility in register packing, which is the ability to efficiently place or "pack" more logic into a given cell.

It should be noted that this specific partitioning of the output signals generated by the logic cell 36 in FIG. 3 are merely exemplary. The output signals may be partitioned in any arbitrary way among the output registers. Furthermore, the output signals do not have to be limited to those specifically identified above. Rather, the output signals can be selected from generic signals, such outputs of the Look Up Tables of the cell, a sum, carry-out signal, or any other signal generated by the arithmetic circuit 24, or any of the inputs to the logic cell.

Figure 4:
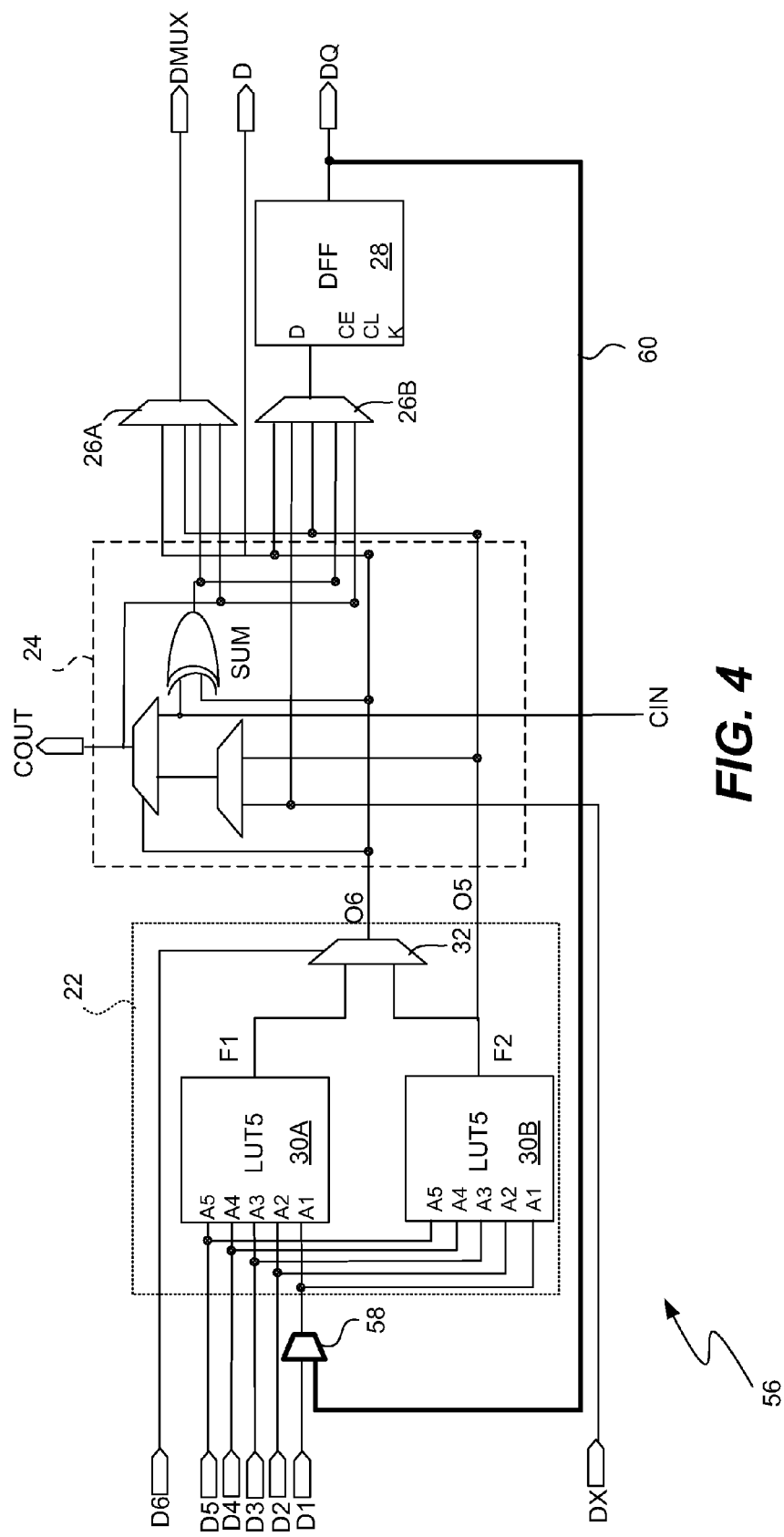
FIG. 4 is a logic cell with register feedback according to another embodiment of the present invention.

Referring to FIG. 4, a logic cell 56 with register feedback according to another embodiment of the present invention is shown. The logic cell 56 is similar to that of FIG. 2, except it includes a multiplexer 58 and a feedback path 60 between the (DQ) output of the register 28 and the multiplexer 58. In the embodiment shown, the multiplexer 58 receives two inputs, D1 and DQ. Accordingly, the registered output of the cell 56 can be selectively provided as an input to both five-input Look Up Tables 30A and 30B. Although the multiplexer 58 is shown coupled to the input D1, it should be noted that the multiplexer 58 can be used to "swap" the registered output (DQ) for any of the logic cell inputs D1 through D6.

Pipelining is common in circuit design technique. With pipelining, a complex circuit is broken down or partitioned into a plurality of clocked pipelined stages. At each stage, the circuit performs a specific operation. With each clock cycle, the results of each stage are transitioned to the next stage. The speed (i.e., frequency) or clock cycle of the pipelined circuit is dictated by the longest propagation path between any two stages in the pipeline. For example, if a number of stages have a propagation delay of 5 nanoseconds, but one stage has a delay of 10 nanoseconds, then the entire circuit must operate at the 10 nanosecond rate. Higher speed performance can therefore be achieved if a better balance of the delays at the various stages of the circuit can be achieved.

Referring to FIG. 5A, a block diagram 65 illustrating how register feedback aids in balancing delays between pipelined stages of a logic circuit according to the present invention is shown. In the diagram, three stages A, B and C are provided. The first stage A has a circuit 68 with a 5 nanosecond delay followed by register 28*a*. The second stage B has a long wire 69 with a 5 nanosecond delay, a first circuit 68*b* with a 5 nanosecond delay and a second circuit 68*b* with another 5 nanosecond delay, followed by a register 28*b*. The third stage C has two circuits 68*c* with a combined 10 nanosecond delay and a register 28*c*. By using the register feedback 60 as illustrated in FIG. 4, the delay of the long wire 69 can be made to occur before (i.e., to the left of) the register 28*a*, rather than after (i.e., or to the right of the register). This shifting of the delay associated with wire 69 is logically illustrated in FIG. 5B. As a result, the delay at each of the three stages has been balanced with each being 10 nanoseconds. Consequently, as illustrated in this example, the register feedback 60 can be used to improve the clock speed or frequency at which the logic circuit operates, thereby improving performance.

FIGS. 6A-6E show various embodiments of the logic cell of the present invention having improved logic functionality capabilities. As noted above, the two Look Up Tables in the cell 20 of FIG. 2 have limited flexibility, as each is limited in receiving the same inputs (D1, D2, D3, D4, D5). FIGS. 6A-6E in contrast show various embodiments where different combinations of inputs can be provided to the two five-input Look Up Tables 30A and 30B respectively. This flexibility aid in improving the density or "packing" as more logic can be squeezed into two Look Up Tables 30A and 30B capable of operating on different inputs, as opposed to operating only on the same set of inputs.

Figure 6A:
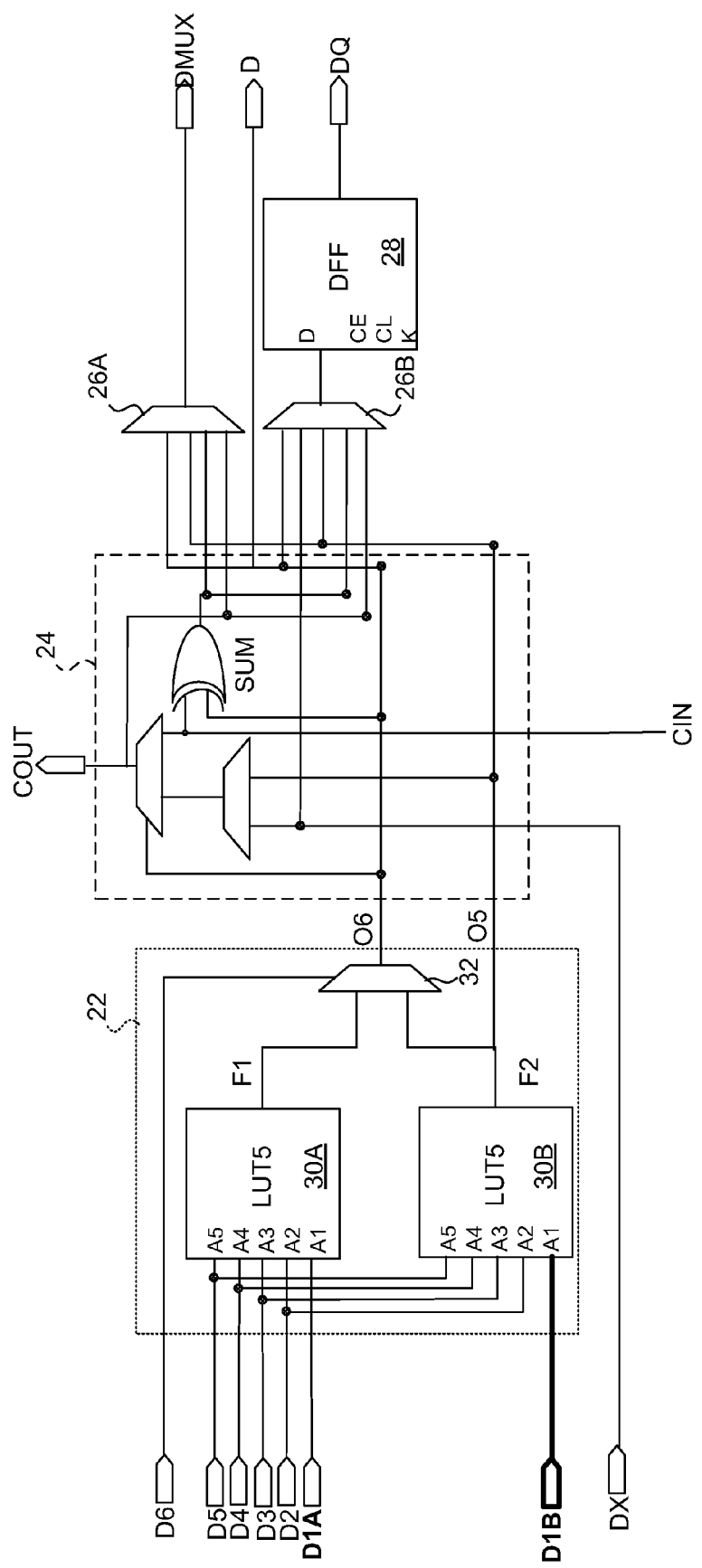
FIGS. 6A-6E are various embodiments of the logic cell of the present invention having improved logic functionality capabilities.

In FIG. 6A, the Look Up Table 30A receives inputs (D1A, D2, D3, D4, D5) and generates function F1 (D1A, D2, D3, D4, D5). Look Up Table 30B receives (D1B, D2, D3, D4, D5) and generates function F2 (D1B, D2, D3, D4, D5). The D1 input to the two Look Up Tables 30A and 30B is therefore different. This arrangement improves flexibility when the two Look Up Tables 30A and 30B are used in a fractured mode. For example, since 30A and 30B are sharing only four inputs, they can be configured as two independent three-input Look Up Tables, or two four-input Look Up Tables, with only two common inputs. It should be noted that the use of different inputs for D1 is only exemplary. Any of the inputs D1 through D5 can be different in accordance with this embodiment.

Figure 6B:
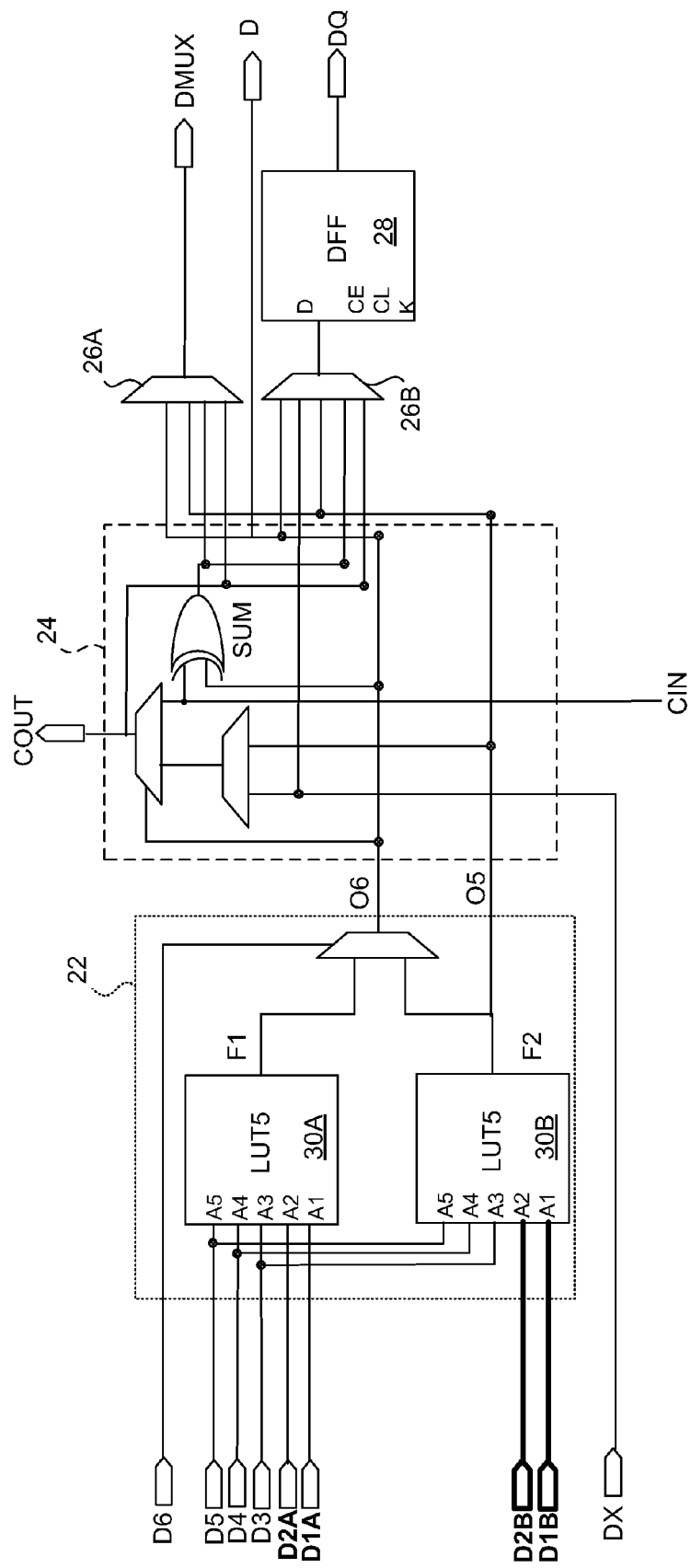

In FIG. 6B, the Look Up Table 30A receives inputs (D1A, D2A, D3, D4, D5) and generates function F1 (D1A, D2A, D3, D4, D5). Look Up Table 30B receives (D1B, D2B, D3, D4, D5) and generates function F2 (D1B, D2B, D3, D4, D5). The D1 and D2 inputs to the two Look Up Tables 30A and 30B is therefore different. This arrangement also improves flexibility when the two Look Up Tables 30A and 30B are used in a fractured mode. For example, since 30A and 30B can each implement four-input Look Up Tables with two common inputs. It should be noted that the use of different inputs for D1 and D2 is only exemplary. Any two of the inputs D1 through D5 can be different in accordance with this embodiment.

Figure 6C:
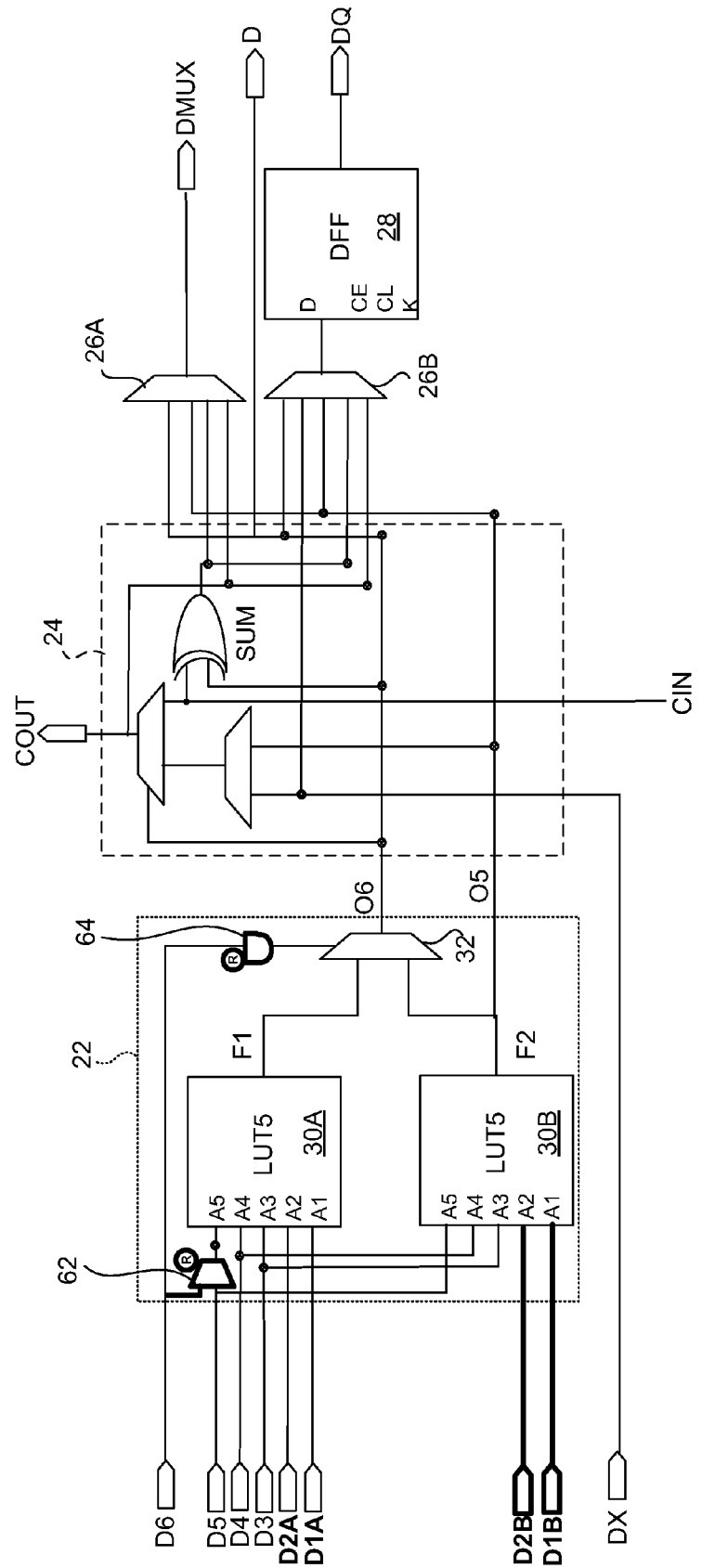

FIG. 6C is similar to FIG. 6B with the Look Up Table 30A receiving inputs (D1A, D2A, D3, D4, D5) and Look Up Table 30B receiving inputs (D1B, D2B, D3, D4, D5). In addition, a swap multiplexer 62, AND gate 64 and a programming bit "R" are provided to control the multiplexer 62 and gate 64. The swap multiplexer 62 allows either the input D5 or D6 to be provided to the fifth input of Look Up Table 30A. When the value of the programming bit R is set so that the input D6 is selected by the multiplexer 62, the output of the AND gate will 64 force the multiplexer 32 to select the function F1 from the Look Up Table 30A. Thus, if D6 is used as an input, the Look Up Table 30A will always be selected by multiplexer 32. With the R bit set, Look Up Table 30A generates the function F1 (D6, D3, D2A, D1A) and 30B generates the function F2 (D5, D4, D2B, D1B). When the R bit is reset, then the 30A and 30B implement two five-input Look Up Tables with two common inputs respectively.

Figure 6D:
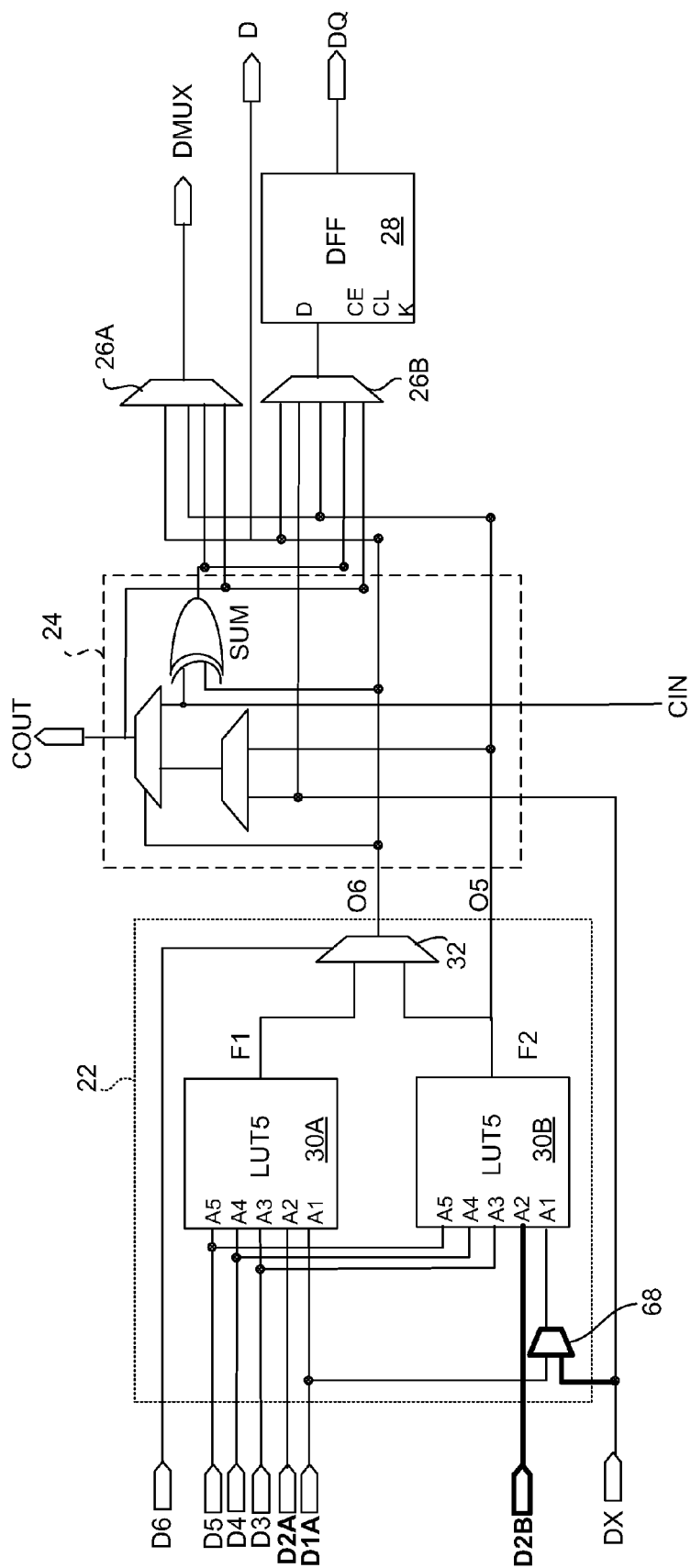

FIG. 6D is similar to FIG. 6B, except it includes a swap multiplexer 68 coupled to receive the DX or D1A inputs. With this arrangement, the Look Up Table 30B receives either DX or D1A, instead of D1B as illustrated in FIG. 6B. By providing the swap multiplexer 68, it allows the DX input to be substituted for the otherwise shared input D1, allowing the 30A and 30B to be fractured into two four-input Look Up Tables. F1 is therefore (D5, D3, D2A, D1A) and F2 is (D5, D4, D2B, DX).

Figure 6E:
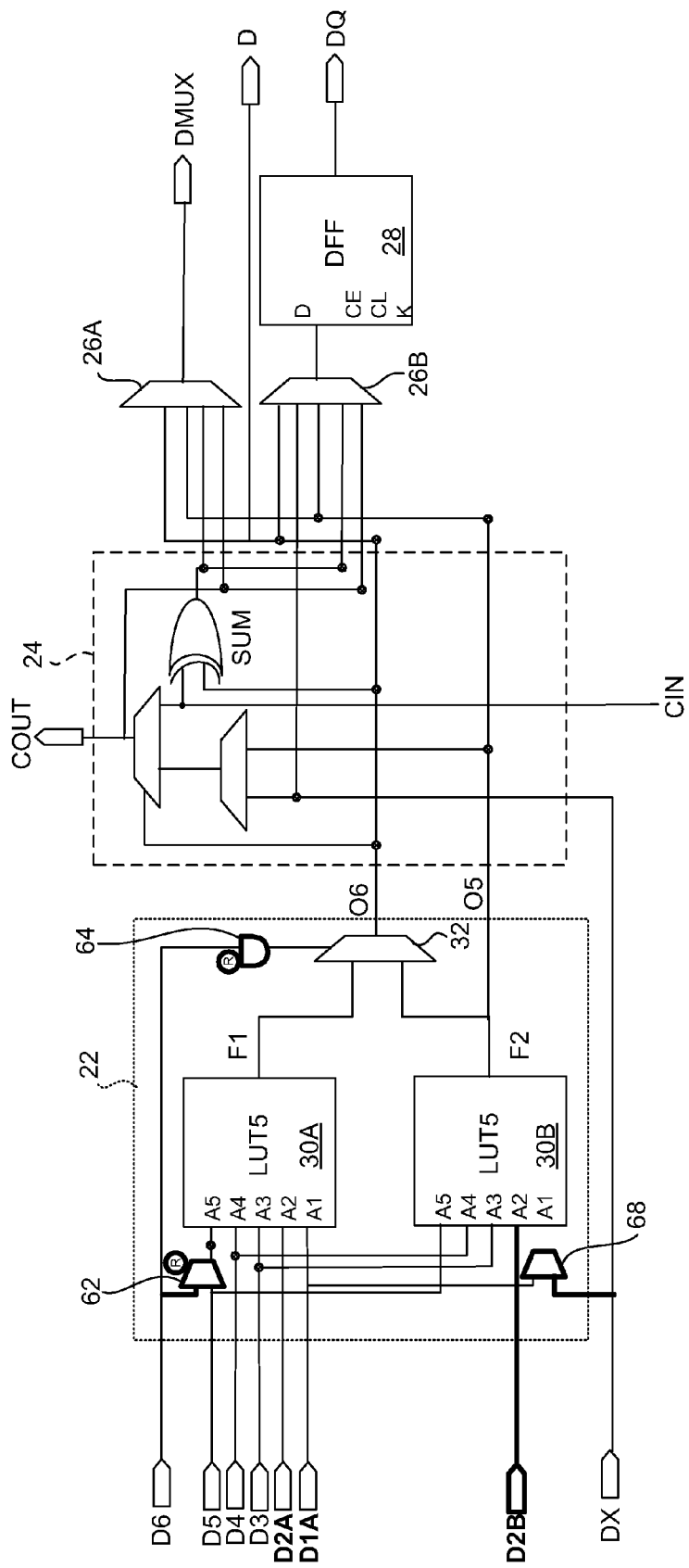

FIG. 6E is the combination of FIGS. 6C and 6D. With this arrangement, 30A and 30B can be configured as two five-input Look Up Tables with common inputs, or two fractured Look Up Tables generating F1(D6, D4, D3, D2A, D1A) and F2(D5, D3, D4, D2B, DX) respectively.

Figure 7:
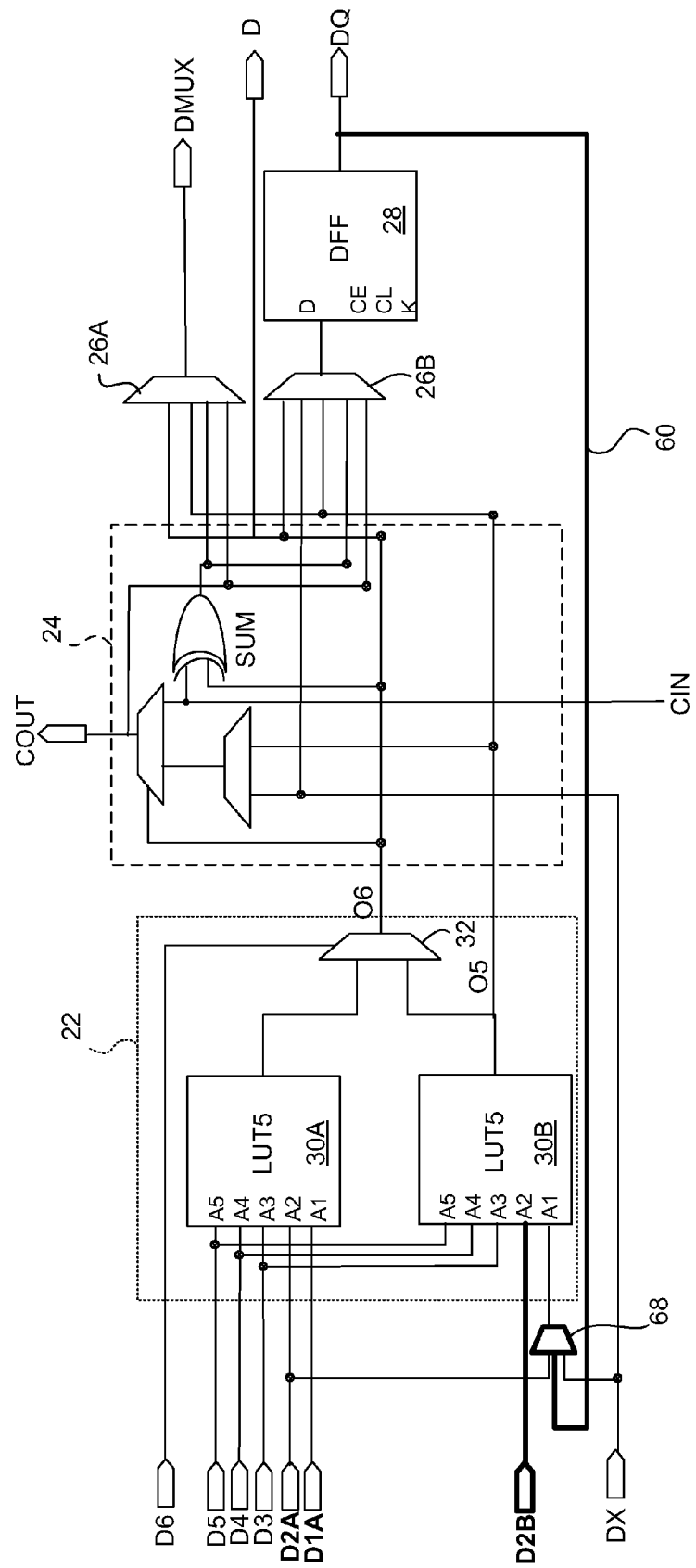
FIG. 7 is another embodiment of a logic cell of the present invention having register feedback and an input swap multiplexer.

FIG. 7 is another embodiment of a logic cell of the present invention having register feedback and an input swap multiplexer. This embodiment is essentially the combination FIG. 5A including register feedback 60 and the swap multiplexer 68 of FIG. 6D. In this case, the swap multiplexer receives three inputs, including D2A, DX and the register feedback 60. With this arrangement, 30A and 30B are capable of generating two 5-LUT functions, the lower of which is able to use the feedback register driven by DX as one of it's inputs.

Figure 8A:
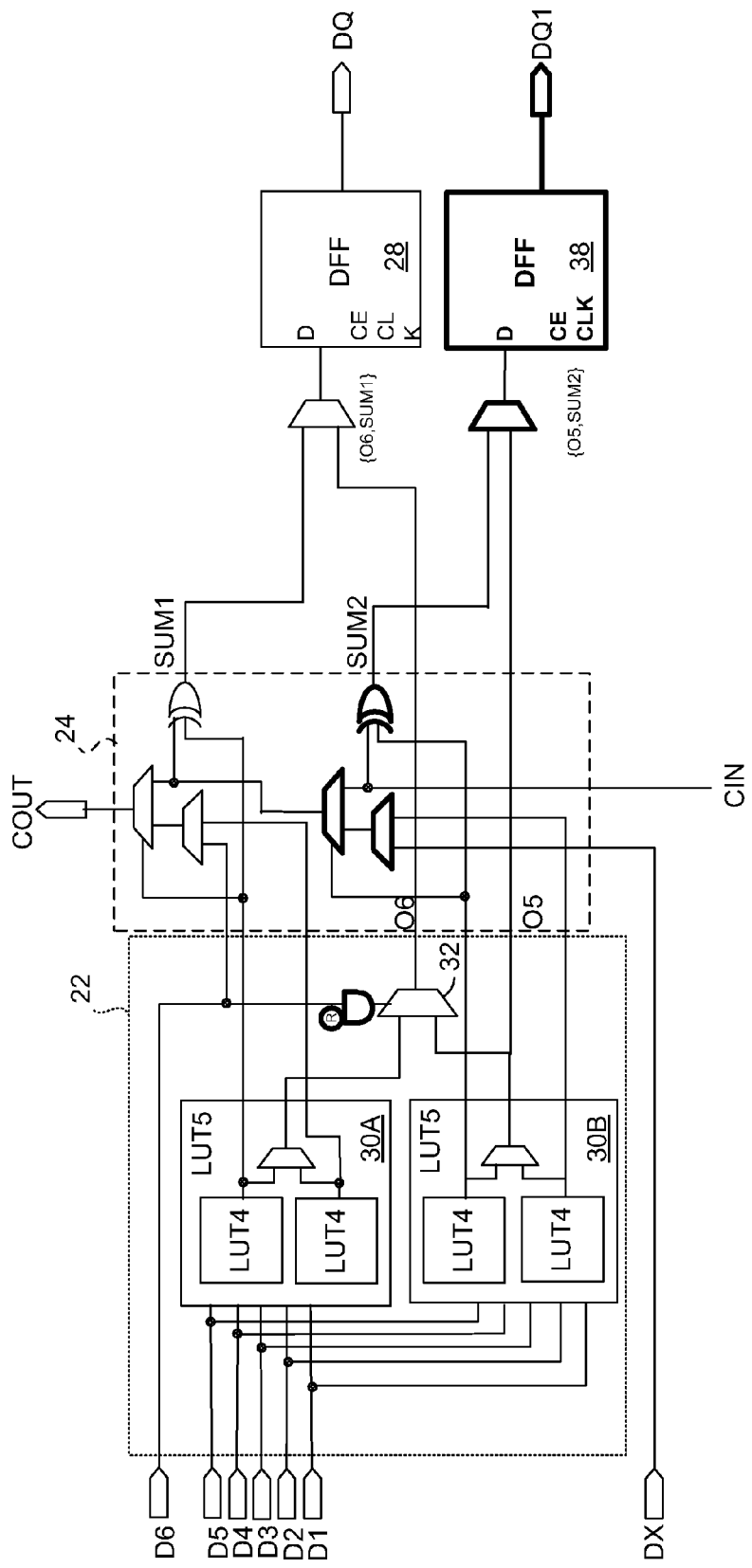
FIGS. 8A-8B is a logic cell capable of performing arithmetic on two bits in accordance with the present invention.

FIG. 8A is a cell having an arithmetic logic circuit 24 capable of generating two sum outputs, SUM1 and SUM2. The first SUM1 signal is derived by the addition from two signals from the first Look Up Table 30A, whereas the second SUM2 is generated from two signals from the second Look Up Table 30B. As is well understood in the art, a five-input Look Up Table is essentially two four-input multiplexers and a select multiplexer that is controlled by the fifth input. For this reason, the diagram of FIG. 8 shows two four-input Look Up Tables and a multiplexer for elements 30A and 30B respectively. For the sake of simplicity, the non-registered output and output multiplexer of the cell are not shown.

Figure 8B:
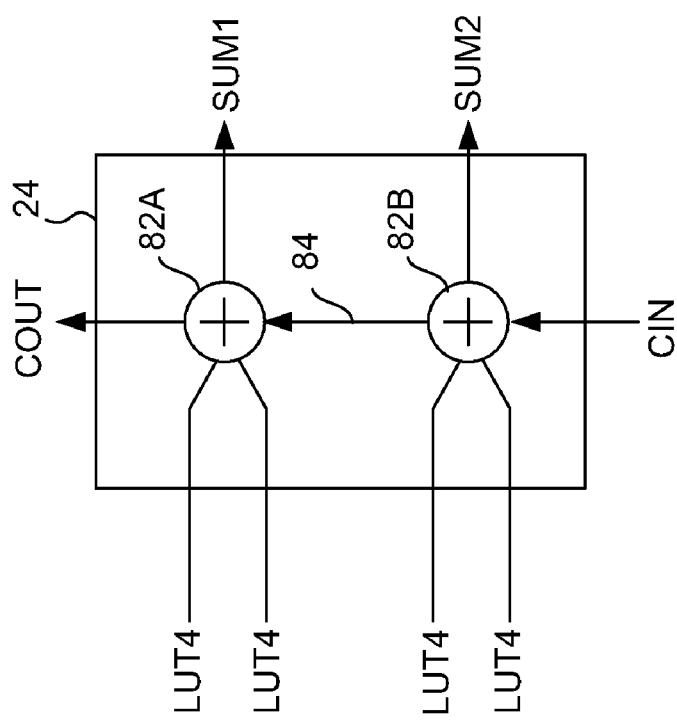

FIG. 8B is a logic diagram illustrating the arithmetic logic circuit 24 of FIG. 8A. As illustrated, the SUM1 signal is generated by a first adder 82A from the sum of two four-input Look Up Tables, and the signal SUM2 is generated by a second adder 82*b* from the sum of a second two four-input Look Up Tables. A carry signal 84 is provided between the two adders 84B and 84A.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. An apparatus, comprising:
   a programmable logic device, the programmable logic device including:
   a plurality of CLBs arranged in rows and columns of an array;
   a plurality of inter-CLB lines interconnecting the CLBs of the array;
   each of the plurality of CLBs having a first slice of logic cells and a second slice of logic cells, wherein the first slice of logic cells and the second slice of logic cells of the CLBs in a given column of the array are interconnected by a first carry chain and a second carry chain respectively; and one of the logic cells including:
one or more Look Up Tables for implanting logic functions on a set of inputs provided to the one logic cell;
an arithmetic logic circuit configured to receive a carry-in signal and to generate a carry-out signal forming part of the first carry chain;
a first output register; and
a second output register,
wherein the set of outputs generated by the logic cell are partitioned among the first output register and the second output register.

2. The apparatus of claim 1, wherein the set of outputs consists of one or more of the following:
outputs of the one or more Look Up Tables of the one logic cell;
a sum output of the arithmetic logic circuit of the one logic cell;
the carry-out signal generated by the arithmetic signal of the one logic cell; and
and one of the set of inputs provided to the one or more Look Up Tables of the one logic cell.

3. The apparatus of claim 1, further comprising a scan-chain coupled between the first output register and the second output register.

4. The apparatus of claim 3, wherein the scan-chain is further interconnected to above logic cells and below logic cells in the given column in the array.

5. The apparatus of claim 1, further comprises a first multiplexer for selecting a first input to the first register and a second multiplexer for selecting a second input to the second register.

6. The apparatus of claim 5, further comprising a scan chain coupled between an output of the first register and an input to the second register through the second multiplexer.

7. The apparatus of claim 6, wherein the first slice of logic cells of the CLBs are interconnected by a first scan chain and the second slice of logic cells of the CLBs are interconnected by a second scan chain.

8. The apparatus of claim 1, wherein the first slice and the second slice of each of the plurality of CLBs includes four logic cells respectively.

9. The apparatus of claim 1, wherein the four logic cells of the first slice and the second slice of the plurality of CLBs each include: one or more of the Look Up Tables; one of the arithmetic logic circuits; the first output register and the second output register.

10. An apparatus, comprising:
a programmable logic device, the programmable logic device including:
a plurality of CLBs arranged in rows and columns of an array;
a plurality of inter-CLB lines interconnecting the CLBs of the array;
each of the plurality of CLBs having a first slice of logic cells and a second slice of logic cells, wherein the first slice of logic cells and the second slice of logic cells of the CLBs in a given column of the array are interconnected by a first carry chain and a second carry chain respectively; and
one of the logic cells including:
one or more Look Up Tables for implanting logic functions on a set of inputs provided to the one logic cell;
an arithmetic logic circuit configured to receive a carry-in signal and to generate a carry-out signal forming part of the first carry chain;
a first output register configured to generate a registered output; and
an input multiplexer configured to select either one of the set of inputs provided to the logic cell or the registered output to the one or more Look Up Tables in the one logic cell.

11. The apparatus of claim 10, further comprising a register feedback path coupled between the registered output of the first register and the input multiplexer.

12. The apparatus of claim 11, further comprising a second of the logic cells having one or more Look Up Tables, the one or more Look Up Tables of the second of the logic cells being configured to programmably receive the registered output of the first register of the one logic cell through the register feedback path.

13. An apparatus, comprising:
a programmable logic device, the programmable logic device including:
a plurality of CLBs arranged in rows and columns of an array;
a plurality of inter-CLB lines interconnecting the CLBs of the array;
each of the plurality of CLBs having a first slice of logic cells and a second slice of logic cells, wherein the first slice of logic cells and the second slice of logic cells of the CLBs in a given column of the array are interconnected by a first carry chain and a second carry chain respectively; and
one of the logic cells including:
a first Look Up Table for implanting logic functions on a first set of inputs provided to the one logic cell; and
a second Look Up Table for implementing logic functions on a second set of inputs provided to the one logic cell,
wherein the first set of inputs and the second set of inputs contain similar inputs, but at least one of the inputs in the first set and the second set are different.

14. The apparatus of claim 13, wherein the first set of inputs comprises (D1A, D2, D3, D4 and D5) and the first Look Up Table generates a logic function F1 (D1A, D2, D3, D4 and D5) and the second set of inputs comprises (D1B, D2, D3, D4 and D5) and the second Look Up Table generates a logic function F2 (D1B, D2, D3, D4 and D5) respectively (FIG. 6A).

15. The apparatus of claim 13, wherein the first set of inputs comprises (D1A, D2A, D3, D4 and D5) and the first Look Up Table generates a logic function F1 (D1A, D2A, D3, D4 and D5) and the second set of inputs comprises (D1B, D2B, D3, D4 and D5) and the second Look Up Table generates a logic function F2 (D1B, D2B, D3, D4 and D5) respectively (FIG. 6B).

16. The apparatus of claim 13, wherein the first Look Up Table is a five-input Look Up Table and the second Look Up Table is also a five-input Look Up Table, the one logic cell further comprising a Look Up Table output multiplexer configured to receive the outputs of the first and the second Look Up Tables and a sixth input for controlling the output of the Look Up Table output multiplexer.

17. The apparatus of claim 16, further comprising a programmable select multiplexer coupled to a selected one of the first set of inputs and the sixth input, the select multiplexer being configured to programmably select either the select one of the first set of inputs or the sixth input as an input to the first Look Up Table.

18. The apparatus of claim 17, further comprising a configurable bit used to control the programmable select multiplexer and the Look Up Table multiplexer so that when the sixth input is selected as an input to the first Look Up Table, the Look Up Table output multiplexer is configured to select the second Look Up Table (claims 18-20 COVER 6C).

19. The apparatus of claim 16, further comprising a seventh input to the one logic cell and a select multiplexer configured to selectively provide either the seventh input or one of the second set of inputs to the second Look Up Table (FIG. 6D).

20. The apparatus of claim 16, further comprising a register feedback signal from a register of the one logic cell and a select multiplexer configured to selectively provide either the register feedback signal or one of the second set of inputs to the second Look Up Table FIG. 7.

21. An apparatus, comprising:
a programmable logic device, the programmable logic device including:
a plurality of CLBs arranged in rows and columns of an array;
a plurality of inter-CLB lines interconnecting the CLBs of the array;
each of the plurality of CLBs having a first slice of logic cells and a second slice of logic cells, wherein the first slice of logic cells and the second slice of logic cells of the CLBs in a given column of the array are interconnected by a first carry chain and a second carry chain respectively; and
one of the logic cells including:
one or more Look Up Tables for implanting logic functions on a set of inputs provided to the one logic cell; and
an arithmetic logic circuit configured to:
receive a carry-in signal and to generate a carry-out signal forming part of the first carry chain; and
generate a first SUM signal and a second SUM signal.

22. The apparatus of claim 21, wherein the one logic cell further comprises a first output register to receive the first SUM signal and a second output register to receive the second SUM signal.

23. The apparatus of claim 22, wherein the arithmetic logic circuit generates the first SUM signal by adding a first two signals from a first Look Up Table and the second SUM signal by adding a second two signals from a second Look Up Table respectively.

* * * * *